US009318438B2

(12) United States Patent
Bossler et al.

(10) Patent No.: US 9,318,438 B2
(45) Date of Patent: Apr. 19, 2016

(54) SEMICONDUCTOR STRUCTURES COMPRISING AT LEAST ONE THROUGH-SUBSTRATE VIA FILLED WITH CONDUCTIVE MATERIALS

(71) Applicant: Micron Technology, Inc., Boise, ID (US)

(72) Inventors: Mark A. Bossler, Meridian, ID (US); Jaspreet S. Gandhi, Boise, ID (US); Christopher J. Gambee, Caldwell, ID (US); Randall S. Parker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/679,845

(22) Filed: Apr. 6, 2015

(65) Prior Publication Data

US 2015/0214160 A1    Jul. 30, 2015

Related U.S. Application Data

(62) Division of application No. 13/712,699, filed on Dec. 12, 2012, now Pat. No. 9,034,769.

(51) Int. Cl.
| | |
|---|---|
| *H01L 23/532* | (2006.01) |
| *H01L 23/538* | (2006.01) |
| *H01L 21/306* | (2006.01) |
| *H01L 21/3065* | (2006.01) |
| *H01L 21/768* | (2006.01) |
| *H01L 23/48* | (2006.01) |
| *H01L 23/522* | (2006.01) |
| *H01L 23/528* | (2006.01) |
| *H01L 21/02* | (2006.01) |

(52) U.S. Cl.
CPC ...... *H01L 23/53238* (2013.01); *H01L 21/3065* (2013.01); *H01L 21/30604* (2013.01); *H01L 21/76898* (2013.01); *H01L 23/481* (2013.01); *H01L 23/528* (2013.01); *H01L 23/5226* (2013.01); *H01L 23/5329* (2013.01); *H01L 23/5384* (2013.01); *H01L 21/02068* (2013.01); *H01L 21/02238* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,930,655 A | 7/1999 | Cooney, III et al. | |
| 6,376,360 B1 | 4/2002 | Cha et al. | |
| 2006/0035416 A1* | 2/2006 | Savastiouk et al. | 438/125 |
| 2007/0105377 A1 | 5/2007 | Koos et al. | |
| 2011/0297319 A1 | 12/2011 | Chen et al. | |
| 2012/0031768 A1 | 2/2012 | Reid et al. | |
| 2012/0119355 A1 | 5/2012 | Chung et al. | |
| 2014/0159239 A1 | 6/2014 | Bossler et al. | |

* cited by examiner

*Primary Examiner* — Michael Lebentritt
*Assistant Examiner* — Aaron Dehne
(74) *Attorney, Agent, or Firm* — TraskBritt

(57) ABSTRACT

A method for selectively removing material from a substrate without damage to copper filling a via and extending at least partially through the substrate. The method comprises oxidizing a semiconductor structure comprising a substrate and at least one copper feature and removing a portion of the substrate using an etchant comprising $SF_6$ without forming copper sulfide on the at least one copper feature. Additional methods are also disclosed, as well as semiconductor structures produced from such methods.

20 Claims, 6 Drawing Sheets

SEMICONDUCTOR STRUCTURES COMPRISING AT LEAST ONE THROUGH-SUBSTRATE VIA FILLED WITH CONDUCTIVE MATERIALS

CROSS-REFERENCE TO RELATED APPLICATION

This application is a divisional of U.S. patent application Ser. No. 13/712,699, filed Dec. 12, 2012, now U.S. Pat. No. 9,034,769, issued May 19, 2015, the disclosure of which is hereby incorporated herein in its entirety by this reference.

FIELD

The present disclosure, in various embodiments, relates generally to semiconductor device design and fabrication. More particularly, the present disclosure relates to methods of selectively etching a substrate material relative to copper, and to resulting semiconductor structures.

BACKGROUND

In the semiconductor industry, there is a continuing effort to increase the integration density of various electronic components (e.g., transistors, diodes, resistors, capacitors, etc.) on integrated circuits. In the electronics industry, packaging density has continuously increased to accommodate more electronic devices into one package. Three-dimensional (3D) stacking technology of wafers has been used to increase the device integration density in integrated circuits and the packaging density in 3D-electronic packaging system. A top layer of one wafer may be connected to a bottom layer of the other wafer through silicon interconnects or vias.

A through-silicon via (hereinafter "TSV") is a vertical electrical connection passing completely through a silicon substrate, such as a wafer or a die. TSV technology is often used in 3D-packaging applications and 3D-integrated circuits, sometimes collectively referred to as "3D-stacking." The TSV is formed by forming a vertical via through the substrate and filling the via with a conductive material, such as copper. A thinning process may then be conducted to remove a portion of the silicon substrate, such as by grinding, polishing (e.g., chemical-mechanical planarization), or a combination thereof, so that an end of the TSV protrudes above the silicon substrate. The copper-filled TSV may be used to form a vertical electrical connection between multiple substrates, such as semiconductor dice. However, conventional thinning processes have many drawbacks. For example, since the protrusion height of the TSV above the surrounding substrate surface is no more than a few hundred microns, it is difficult to achieve a consistent protrusion height of the TSVs using grinding or polishing processes. This process limitation results in 3D-stacking with inferior performance, especially when there are multiple TSVs protruding above the substrate surface. As an alternative to abrasive techniques used to expose TSV ends and for better process control, conventional etch chemistries may be used to remove silicon from a back surface of a substrate to expose a TSV end. The etch chemistry may include a wet etching process using potassium hydroxide (KOH), ammonium hydroxide ($NH_4OH$) or tetramethylammonium hydroxide (TMAH), or a dry etching process using $HBr/O_2$, $CF_4$ or $NF_3$. However, such etch processes are slow, and are not selective to oxides used as a liner for copper-filled TSVs. In addition, while bias RF power may be used to speed up the etch rate, the etch rate is still undesirably slow, and a detrimental byproduct of such an approach is microtrenching of the substrate material along any exposed features. While a sulfur hexafluoride ($SF_6$)-containing etchant may be used to remove a portion of the substrate bearing TSVs at a much faster (e.g., eight times faster) rate than other etch chemistries, and $SF_6$ is highly selective to the oxide, sulfur in the $SF_6$-containing etchant reacts with copper of the TSV, producing copper sulfide on the copper-filled TSV in the form of a "copper sulfide balloon." The copper sulfide is corrosive and erodes exposed copper. The copper sulfide is also difficult to remove and negatively impacts 3D-stacking connectivity of multiple semiconductor substrates if not thoroughly removed.

DETAILED DESCRIPTION

Figure 1A:
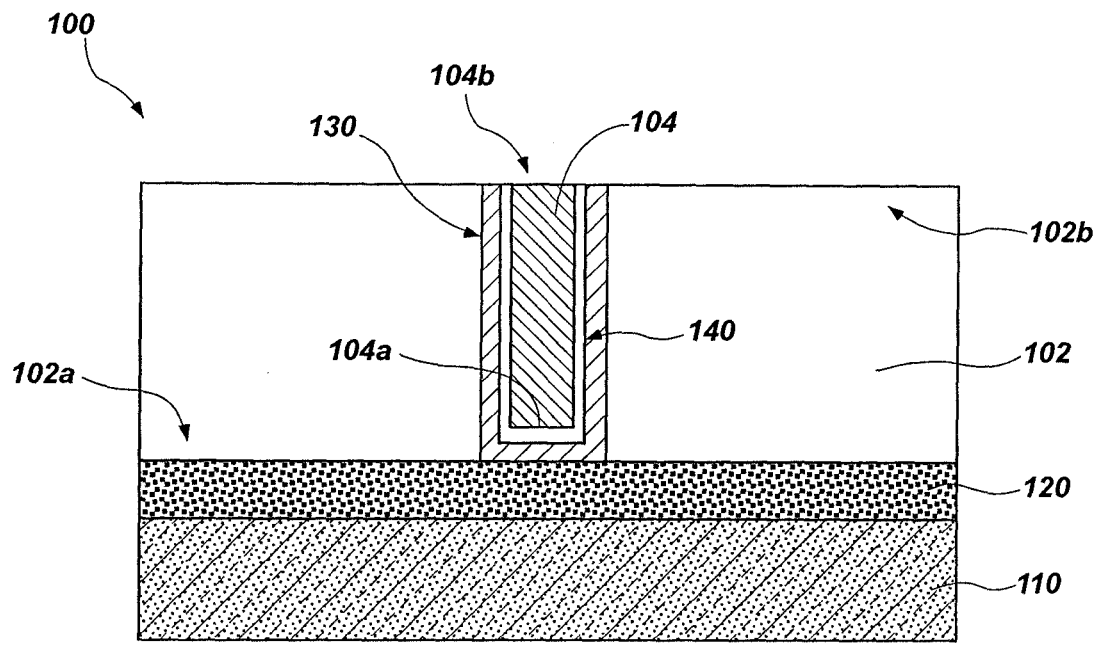
FIGS. 1A-1H are cross-sectional views of various stages of selective removal of a substrate relative to a copper feature according to one embodiment of the present disclosure.

The following description provides specific details, such as material types, material thicknesses, and processing conditions in order to provide a thorough description of embodiments of the disclosure. However, a person of ordinary skill in the art will understand that embodiments of the present disclosure may be practiced without employing these specific details. Indeed, the embodiments of the present disclosure may be practiced in conjunction with conventional fabrication techniques employed in the industry.

In addition, the description provided herein does not form a complete process flow for forming a semiconductor device structure, and the semiconductor device structures described below do not form a complete semiconductor device. Only those process acts and structures necessary to understand the embodiments of the present disclosure are described in detail below. Additional acts to form the complete semiconductor device may be performed by conventional fabrication techniques. Also the drawings accompanying the application are for illustrative purposes only, and are thus not drawn to scale. Elements common between figures may retain the same numerical designation. Furthermore, while the materials described and illustrated herein may be formed as layers, the materials are not limited thereto and may be formed in other three-dimensional configurations.

As used herein, any relational terms, such as "front" and "back," are used for clarity and convenience in understanding the present disclosure and accompanying drawings and do not connote or depend on any specific preference, orientation or order.

As used herein, the term "substantially," in reference to a given parameter, property or condition, means to a degree that one of ordinary skill in the art would understand that the given parameter, property, or condition is met with a small degree of variance, such as within acceptable manufacturing tolerances.

Embodiments of the present disclosure include methods of selectively removing a portion of a substrate relative to a copper feature using a sulfur hexafluoride ($SF_6$)-containing etchant, and semiconductor structures produced by these methods. The embodiments of the present disclosure also include methods of selectively removing a portion of a silicon substrate relative to the copper feature using the $SF_6$-containing etchant, and semiconductor structures produced by these methods.

As described below, the portion of the substrate is selectively removed using the $SF_6$-containing etchant relative to the copper in the TSV. However, it will be readily apparent to one of ordinary skill in the art that the methods described herein may be used in various applications. In other words, the methods of the present disclosure may be used in other applications where it is desired to selectively remove a portion of the substrate using a $SF_6$-containing etchant without removing the copper or any other conductive material that reacts with sulfur.

FIGS. 1A-1H are cross-sectional views of various stages of selective removal of the substrate to the copper in a TSV according to one embodiment of the present disclosure.

FIG. 1A shows a semiconductor structure 100 disposed on a carrier 110, and a bonding material 120 between the semiconductor structure 100 and the carrier 110. Semiconductor structure 100 includes a substrate 102; a TSV (through-substrate via) 104 substantially filled with a conductive material, such as copper; an insulating material 130 and a diffusion barrier material 140 positioned between the substrate 102 and the TSV 104. The insulating material 130 forms a low capacitance, electrically resistive barrier between the conductive material in the TSV 104 and the substrate 102 to prevent electrical shorting between the conductive material in the TSV 104 and the substrate 102. The insulating material 130 may be silicon oxide. The diffusion barrier material 140 may be applied over the insulating material 130 to prevent the diffusion of the conductive material in the TSV 104 across the insulating material 130 to the substrate 102. Non-limiting examples of the diffusion barrier materials 140 may include tantalum (Ta), tantalum nitride (TaN), titanium (Ti), titanium nitride (TiN), titanium aluminum nitride (TiAlN), titanium zirconium (TiZr), or titanium zirconium nitride (TiZrN). Prior to substantially filling the TSV 104 with the conductive material, the insulating material 130 and the diffusion barrier material 140 may be formed using various conventional techniques. By way of non-limiting example, the insulating material 130 and the diffusion barrier material 140 may be formed by physical vapor deposition (PVD), chemical vapor deposition (CVD), electroless deposition, atomic layer deposition (ALD), or combinations thereof.

As used herein, the term "TSV" means and includes a via filled with the conductive material unless the context clearly dictates otherwise. A front surface 102a of substrate 102, which may be characterized as an active surface, is in contact with the bonding material 120. The carrier 110 and the bonding material 120 may be conventional materials used in 3D packaging processes. Conventional methods for forming and filling the TSV with the conductive material may be used and, therefore, are not described in detail herein.

The thickness of the substrate 102 may be at any value depending upon the depth of the incoming TSV. In one embodiment, the substrate 102 may have a thickness of from about 40 microns (μm) to about 60 μm, such as about 55 μm. The substrate 102 may be formed from a material having an initial thickness of more than about 700 μm before a portion thereof is removed to produce the substrate 102 having a thickness of about 55 microns. Conventional methods known in the art for reducing the thickness of the substrates may be used. By way of example and not limitation, one or more of an etching process, a grinding process, and a polishing process (e.g., a chemical-mechanical polishing operation) may be used to form the substrate 102 from the initial material.

Although not shown for simplicity, features (e.g., transistors, capacitors, resistors, diodes, microelectromechanical devices, nanoelectromechanical devices, and optical devices), electrically conductive lines (e.g., digit lines), one or more overlying dielectric materials and/or metallization materials, or the like, may be formed in, on or above active surface 102a of substrate 102. The features, lines and materials may be formed in, on or above active surface 102a by any conventional method and, therefore, are not described in detail herein.

As used herein, the term "substrate" means and includes a base material or construction upon which additional materials are formed. The substrate may be a semiconductor substrate, a base semiconductor material on a supporting structure, a metal electrode or a semiconductor substrate having one or more materials, structures or regions formed thereon. The substrate may be a conventional silicon substrate, or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. The substrate may be doped or undoped. Furthermore, when reference is made to a "substrate" in the following description, previous process stages may have been utilized to form materials, regions, or junctions in the base semiconductor structure or foundation. In one embodiment, the substrate is a silicon-containing material, such as a silicon substrate.

FIGS. 1A-1H are meant to illustrate one embodiment of the methods of selective removal of the substrate, and do not necessarily limit the location of the TSV(s) in the substrate, the numbers of TSVs, or the profile and shape of any TSV.

Figure 1B:
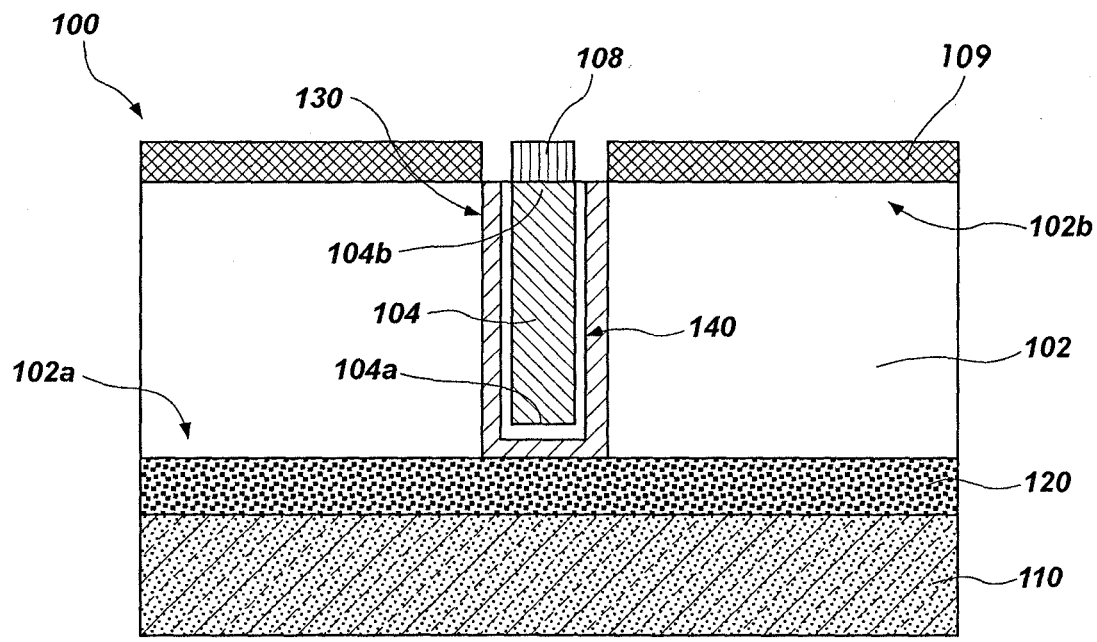

The semiconductor structure 100 of FIG. 1A may be subjected to an oxidation process, providing the structure of FIG. 1B in which an oxide material 109 is formed overlying the substrate 102 and a copper oxide material 108 is formed overlying the TSV 104. During the oxidation process, exposed portions of the substrate 102 and the TSV 104 may be oxidized. For example, a back surface 102b of substrate 102 may be oxidized, forming the oxide material 109 overlying and in direct contact with the substrate 102, while the copper on a back end 104b of the TSV 104 may be oxidized to form the copper oxide material 108 overlying and in direct contact with the copper of the TSV 104. If the substrate 102 is a silicon-containing material, such as a silicon substrate, the oxide material 109 may be a silicon oxide. The copper oxide material 108 may be a material including copper and oxygen, such as CuO, $Cu_2O$, or combinations thereof.

The oxidation process may include exposing the semiconductor structure 100 to a dry oxidation process or a wet oxidation process. The oxidation process may include exposure to an oxidizing agent, such as oxygen ($O_2$); ozone ($O_3$); hydrogen peroxide (e.g., at least 20% $H_2O_2$ by volume); ozonized purified water (e.g., including at least about 2 ppm ozone); a 1:20:100 (v/v/v) solution of ammonium hydroxide ($NH_4OH$), $H_2O_2$ and water; a 4:1 (v/v) solution of sulfuric acid ($H_2SO_4$) and $H_2O_2$; a 1:1:6 (v/v/v) solution of hydrochloric acid (HCl), $H_2O_2$ and water; and nitric acid ($HNO_3$). By way of non-limiting example, an oxygen-containing plasma may be used, such as an oxygen ($O_2$) plasma or an ozone ($O_3$) plasma. The production of $O_2$ and $O_3$ plasmas are known in the art and, therefore, are not described in detail herein. In one embodiment, the oxidation process includes an $O_2$ plasma. Temperature and pressure conditions for forming the oxygen-containing plasma may be selected by a person of ordinary skill in the art, as well as the temperature and pressure conditions at which the semiconductor structure 100 is subjected to the oxygen-containing plasma. The semiconductor structure 100 of FIG. 1A may be exposed to the oxygen-containing plasma, such as the $O_2$ plasma, for an amount of time sufficient to oxidize an exposed portion of the substrate 102, for example, back surface 102b, and an exposed portion of the TSV 104. For example, the semiconductor structure 100 may be exposed to the $O_2$ plasma for between about 5 seconds and about 120 seconds, such as between about 30 seconds and about 90 seconds. Following the oxidation process, the oxide material 109 and the copper oxide material 108 may be formed at a thickness ranging from about 20 Å to about 40 Å.

If, however, a wet oxidation process is to be used, the oxidizing agent may be $H_2O_2$ (e.g., at least 20% $H_2O_2$ by volume); ozonized purified water (e.g., water including at least about 2 ppm ozone); a 1:20:100 (v/v/v) solution of ammonium hydroxide ($NH_4OH$), $H_2O_2$ and water; a 4:1 (v/v) solution of sulfuric acid ($H_2SO_4$) and $H_2O_2$; a 1:1:6 (v/v/v) solution of hydrochloric acid (HCl), $H_2O_2$ and water; or nitric acid ($HNO_3$). One example of a wet oxidation process may include exposing the back surface 102b of semiconductor substrate 102 to an oxidant solution that includes at least about 20% hydrogen peroxide ($H_2O_2$) at 40° C. for about 30 seconds to form on substrate 102 an oxide material 109 having a thickness of about 20 Å to about 40 Å.

Without being bound by any theory, it is believed that the oxidizing agent reacts with a portion of the exposed copper on the back end 104b of the TSV 104 to form the copper oxide material 108. The copper oxide material 108 is believed to protect the underlying copper of the back end 104b of TSV 104 from exposure to corrosive gases, such as $SF_6$, during subsequent processing acts. Thus, as explained in more detail below, $SF_6$-containing etch chemistries may be used to remove a portion of the substrate 102 without corroding or otherwise adversely affecting the copper of the TSV 104.

Figure 1C:
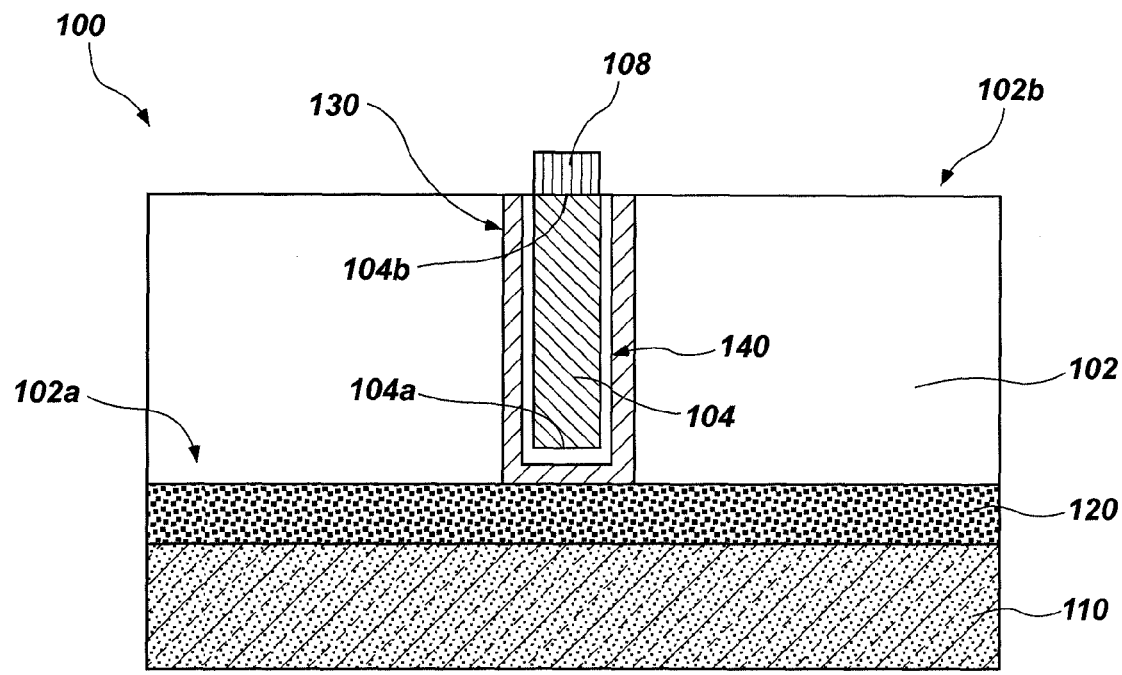

Referring to FIG. 1C, oxide material 109 of substrate 102 may then be selectively removed from the back surface 102b of substrate 102 to provide a semiconductor structure 100 including the substrate 102, the insulating material 130, the diffusion barrier material 140, the TSV 104, and the copper oxide material 108 on the back end 104b of the TSV 104. Oxide material 109 may be removed by any technique known in the art, such as a dry (i.e., reactive ion) etching process or a wet (i.e., chemical) etching process. The etching process used to remove the oxide material 109 may remove the oxide material 109 at a substantially faster rate than the copper oxide material 108, providing selective removal of oxide material 109 to copper oxide material 108. For instance, the etch rate of the oxide material 109 may be at least about two times greater than that of the copper oxide material 108 when exposed to the same etching process. In one embodiment, the etch rate of the oxide material 109 may be at least about ten times greater than that of the copper oxide material 108 when exposed to the same etching process. By way of non-limiting example, hydrofluoric acid (HF) either alone or in combination with a buffer, such as ammonium fluoride ($NH_4F$), may be used to remove the oxide material 109. For instance, the oxide material 109 may be removed by exposing the semiconductor structure 100 to a dilute (e.g., 2% by volume) HF solution at 25° C. for about 40 seconds to remove oxide material 109 from the substrate 102. In some embodiments, other acids may be used in combination with HF including, but not limited to, nitric acid ($HNO_3$) or sulfuric acid ($H_2SO_4$). As an alternative to using a HF solution, a hot alkaline base may be used to remove oxide material 109. Non-limiting examples of alkaline bases useful for removing oxide material 109 may include sodium hydroxide or potassium hydroxide. Following removal of the oxide material 109, the copper oxide material 108 may remain over the back end 104b of TSV 104, thereby protecting the back end 104b of the TSV 104.

Figure 1D:
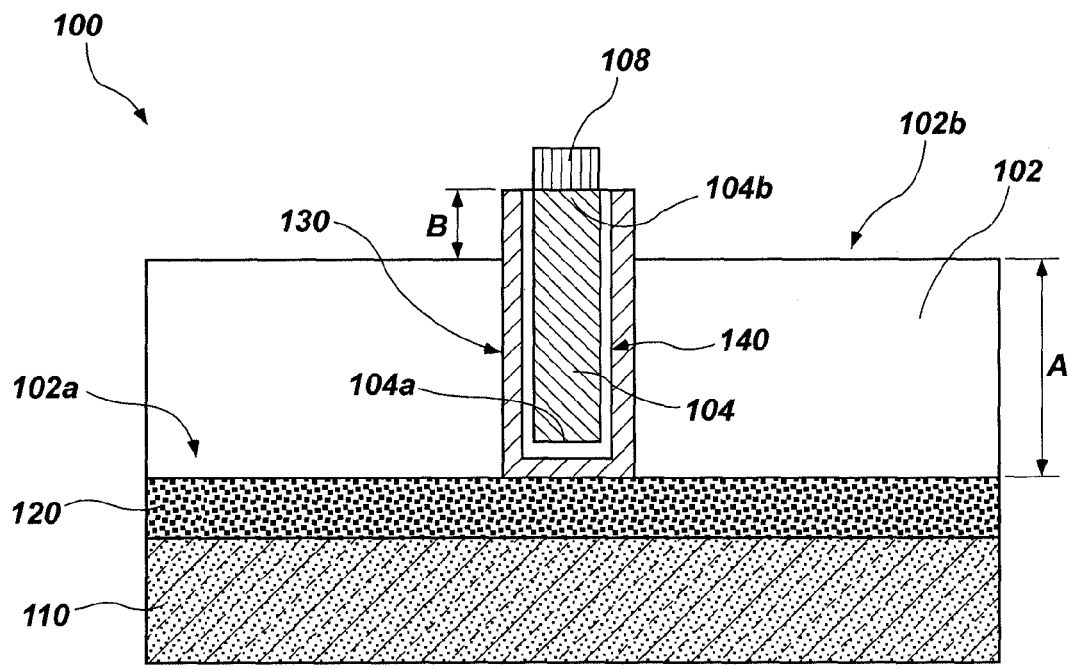
Figure 1E:
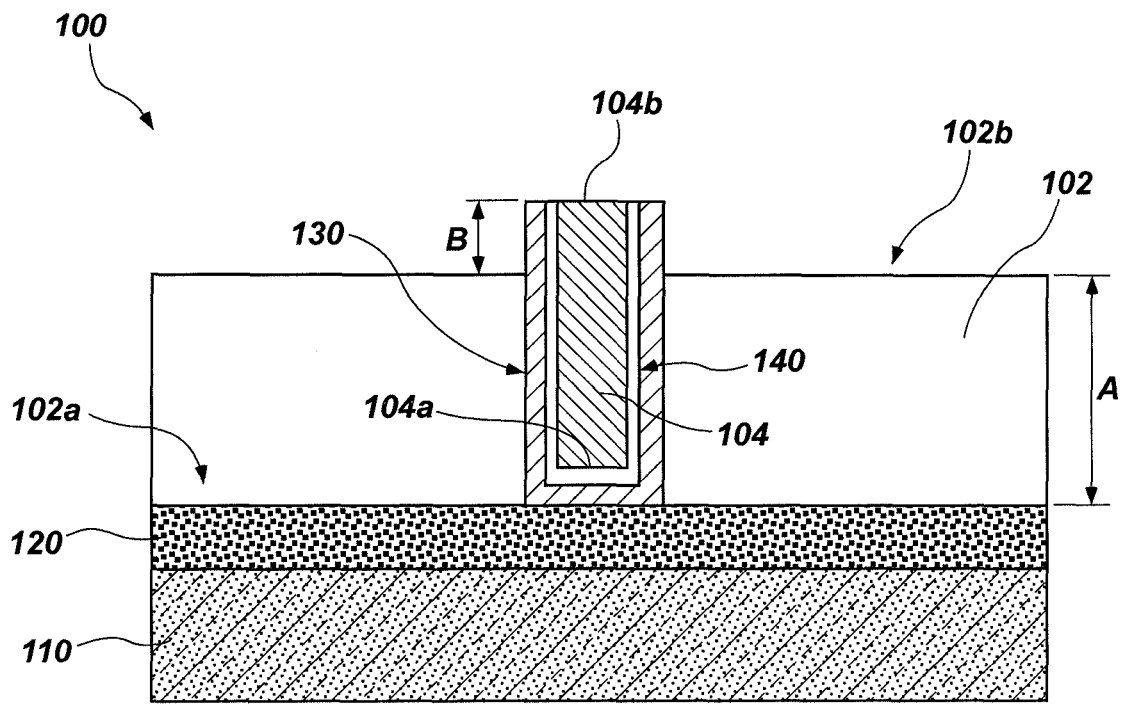

A portion of substrate 102 may be removed by exposing the semiconductor structure 100 to a $SF_6$-containing etchant to provide the semiconductor structure 100 having a portion of TSV 104 protruding above the surface of substrate 102 at a height of "B" as shown in FIG. 1D. The $SF_6$-containing etchant may remove the substrate 102 at a substantially faster rate than the insulating material 130 and the diffusion barrier material 140, providing selective removal of substrate 102 to the insulating material 130 and the diffusion barrier material 140. Therefore, a portion of TSV 104 protruding above the surface of substrate 102 may retain the insulating material 130 and the diffusion barrier material 140 on its sidewalls. The copper oxide material 108 may protect the underlying copper of the back end 104b of TSV 104 from exposure to the $SF_6$-containing etchant, while the insulating material 130 and the diffusion barrier material 140 may protect the underlying copper of the protruding sidewalls of TSV 104 from exposure to the $SF_6$-containing etchant. The etch rate of the substrate 102 may, for example, be at least about two times greater than that of the insulating material 130 and the diffusion barrier material 140 when exposed to the same etching process. In one embodiment, the etch rate of the substrate 102 may be about eight times greater than that of the insulating material 130 and the diffusion barrier material 140 when exposed to the same etching process.

The $SF_6$-containing etchant may be used to remove a portion of the substrate 102, such that the substrate 102 is recessed below the TSV 104. By way of example, the $SF_6$-containing etchant may be used to remove from about 2 microns to about 10 microns of the substrate 102. The $SF_6$-containing etchant may include a $SF_6$ plasma, a $SF_6$ plasma in combination with a $Cl_2$ plasma, an $SF_6$ plasma in combination with $SCl_6$ plasma, a $SF_6$ solution, and a solution of $SF_6$ and $SCl_6$. Since the TSV 104 is protected by the copper oxide material 108 at the back end 104b and by the insulating material 130 and the diffusion barrier material 140 at the sidewalls, the copper of the TSV 104 may be substantially unaffected by exposure to the $SF_6$-containing etchant. By forming the copper oxide 108 over the copper of the TSV 104 and retaining the insulating material 130 and the diffusion barrier material 140 on the protruding sidewalls of the TSV 104, the copper is unable to react with sulfur in the $SF_6$-containing etchant, reducing or preventing the formation of copper sulfide on the TSV 104. Accordingly, the undesirable formation of a copper sulfide balloon on the TSV 104 may be minimized, if not prevented. In some embodiments, the height B of TSV 104 extending above the back surface 102b of substrate 102 may be about 4 microns. The thickness of the remaining substrate 102 may be about 51 microns (i.e., a height "A" in FIG. 1D may be about 51 microns). In some embodiments, semiconductor structure 100 may be subjected to more than one cycle of selective removal of the substrate 102 until a desired height of the TSV 104 protrudes above the back surface 104b of substrate 102.

The copper oxide material 108 on the TSV 104 may then be removed by conventional techniques for removing a copper oxide material selective to the substrate 102. In some embodiments, the copper oxide material 108 may be removed by etching with hydrogen ($H_2$) plasma. In some embodiments, the copper oxide material 108 may be removed by a conventional cleaning process using a vapor-phase fluid based on hydrofluorocarbon-azeotropic cleaning chemistry (i.e., an ACC cleaning process). In some embodiments, at least a portion of the insulating material 130 and the diffusion barrier material 140 may be removed during the conventional cleaning process.

By utilizing the methods of the present disclosure, an etch chemistry containing $SF_6$ may be used to remove a portion of the silicon substrate without forming copper sulfide on the exposed copper portions. The methods of the present disclosure enable the desired portion of the silicon substrate to be removed about eight times faster than removal without first oxidizing the copper.

Figure 1F:
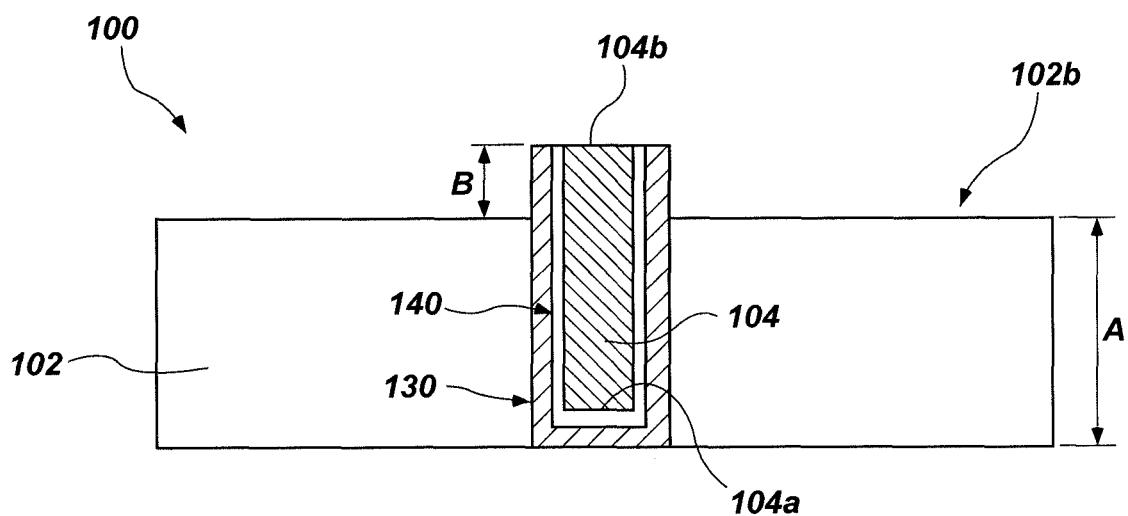

Then, semiconductor structure 100 may be removed from carrier 110, as shown in FIG. 1F, for further semiconductor processing. The carrier 110 and bonding material 120 may be removed by conventional techniques, which are not described in detail herein.

Figure 1G:
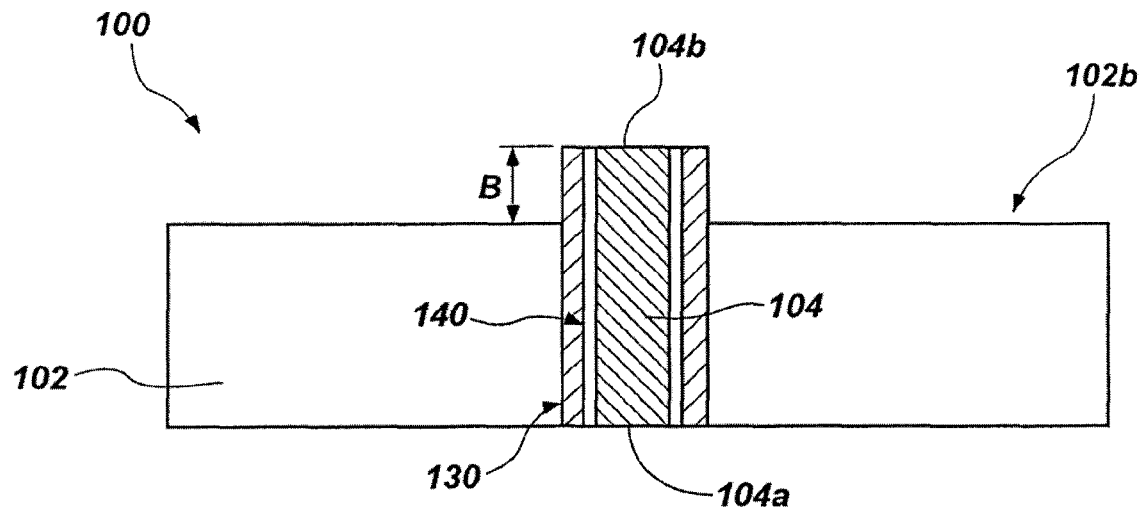

The insulating liner material 130 and the diffusion barrier material 140 may be removed from a front end 104a of the TSV 104 to expose at least a portion of the front end 104a of the TSV 104, as shown in FIG. 1G, for further semiconductor processing. The insulating liner material 130 and the diffusion barrier material 140 may be removed by conventional techniques, which are not described in detail herein.

Figure 1H:
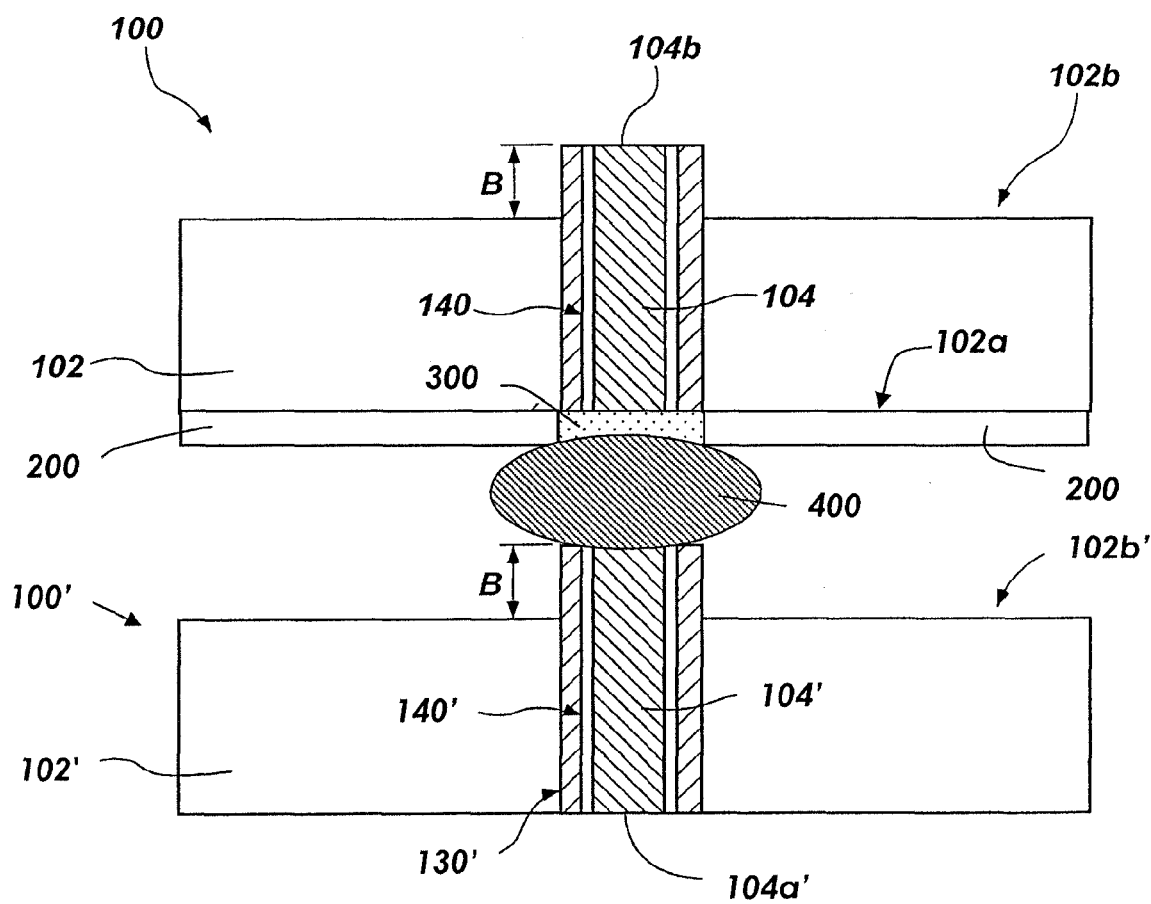

Multiple semiconductor structures 100 may be interconnected by stacking the semiconductor structures 100. FIG. 1H shows a stack of two semiconductor structures where the first semiconductor structure 100 is interconnected with a second semiconductor structure 100'. Each of the first and second semiconductor structures 100, 100' may include TSV 104, 104'. A passivation material 200 may be formed on the surface 102b of substrate 102 to inhibit corrosion of or other environmental damage to the underlying substrate 102 and the components therein. By way of example and not limitation, the passivation material 200 may include at least one of an organic material (e.g., a polymer) and an inorganic material (e.g., an oxide or nitride). Then, an under bump metallurgy 300 may be formed before stacking the semiconductor structures 100 and 100' using a conductive material 400. By way of non-limiting example, the conductive material 400 may include a solder material, a conductive resin, a conductor-filled resin, or an anisotropic conductive film. Although the electronic stack of FIG. 1H includes only two semiconductor structures (100 and 100'), it is understood that the electronic stack may include additional semiconductor structures and additional TSVs. The first semiconductor structure 100 may have a plurality of TSVs 104, some of which may be connected to TSVs 104' of the second semiconductor structure 100', while other TSVs 104 may be connected to TSVs of other semiconductor structures. Although FIG. 1H shows one embodiment of the methods for stacking the semiconductor structures 100, one of ordinary skill in the art will understand that other methods for stacking the semiconductor structures 100 may be utilized.

A method for selectively removing a substrate may comprise oxidizing a semiconductor structure comprising a substrate and at least one copper feature. A portion of the substrate is removed using an etchant comprising $SF_6$ without forming copper sulfide on the at least one copper feature.

A method for selectively removing a substrate may comprise subjecting a semiconductor material comprising a substrate, at least one copper feature, and an insulating component between the substrate and an unexposed portion of the at least one copper feature, to an oxidizing agent to form a silicon oxide material on the substrate and a copper oxide material on an exposed portion of the at least one copper feature. The insulating component may comprise an insulating material and a diffusion barrier material. The silicon oxide material is removed to expose the substrate. At least a portion of the substrate is removed using a $SF_6$-containing etchant without removing the copper oxide material and the insulating component.

A method for removing a portion of a substrate may comprise exposing a semiconductor structure comprising a silicon-containing material, an insulating material, a diffusion barrier material, and at least one copper-filled through-substrate via to an oxidizing agent to form a copper oxide material on the copper, wherein the insulating material and the diffusion barrier material are positioned between the silicon-containing material and the at least one copper-filled through-substrate via. A portion of the silicon-containing material is selectively removed with a $SF_6$-containing etchant to form the at least one copper-filled through-substrate via extending above a surface of the silicon-containing material.

Although FIGS. 1A-1H show one embodiment of the methods of selectively removing substrate relative to the copper in the TSV, one of ordinary skill in the art will understand that the above-mentioned methods may be utilized for other applications and structures. Indeed, the methods of the present disclosure are not limited to the semiconductor structures containing a copper-filled TSV and a silicon substrate. Rather, the methods of the present disclosure may be used in any situations where exposed silicon is to be selectively removed without removing copper. For instance, the methods of the present disclosure may be used with other types of substrates and TSVs filled with other conductive materials as long as the conductive material and substrate are oxidized upon exposure to the oxidizing agent, and the resulting oxides of the conductive material and the substrate are selectively etchable using an $SF_6$-containing etchant. By way of non-limiting example, the conductive materials may include silver, aluminum, titanium, nickel, gold, or tungsten. The oxide of the conductive material may be used to protect the underlying conductive material from reactions with sulfur.

A semiconductor structure may comprise a substrate comprising at least one through-substrate via filled with a conductive material, an upper portion of the at least one through-substrate via extending above a surface of the substrate, an insulating material and a diffusion barrier material over sidewalls of the at least one through-substrate via.

The semiconductor structure 100 may include one TSV or a plurality of TSVs. Additionally, each TSV in the semiconductor structure may be same or different from each other.

Figure 2A:
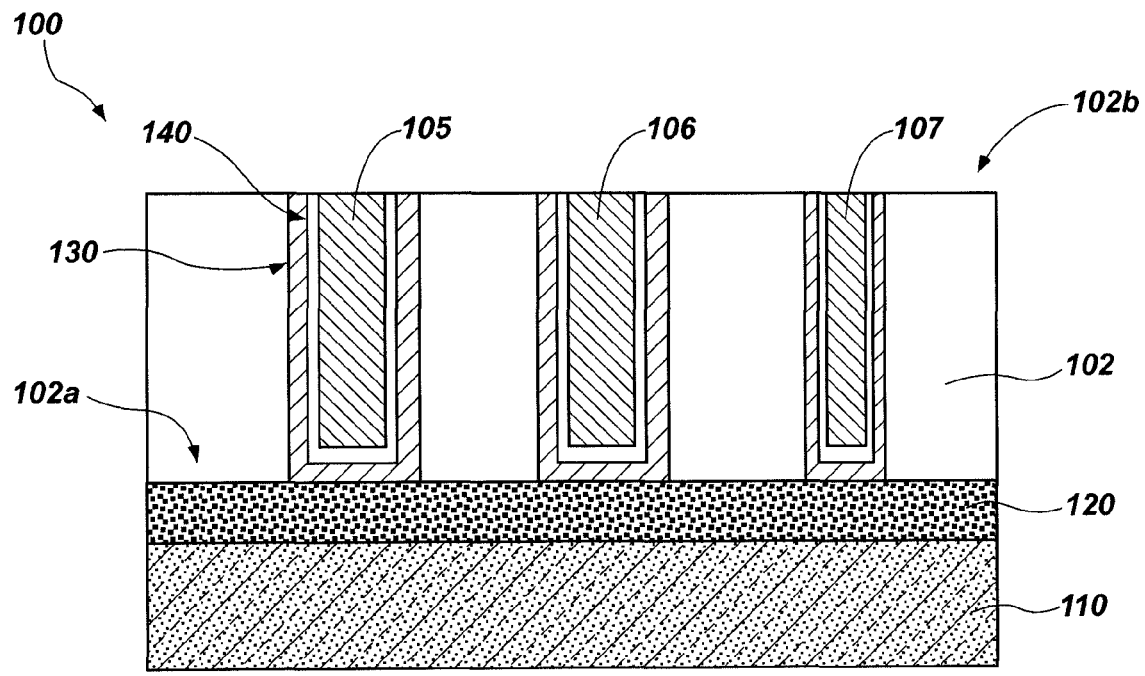
FIGS. 2A-2C are cross-sectional views of various stages for the formation of a semiconductor structure having multiple copper features.
Figure 2B:
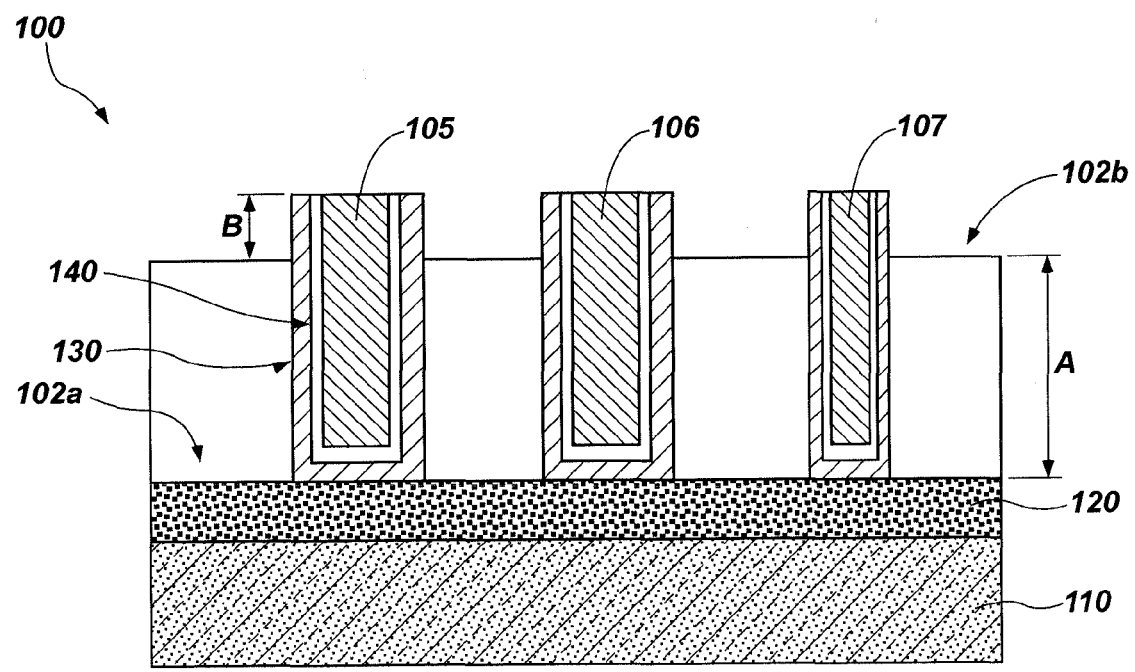
Figure 2C:
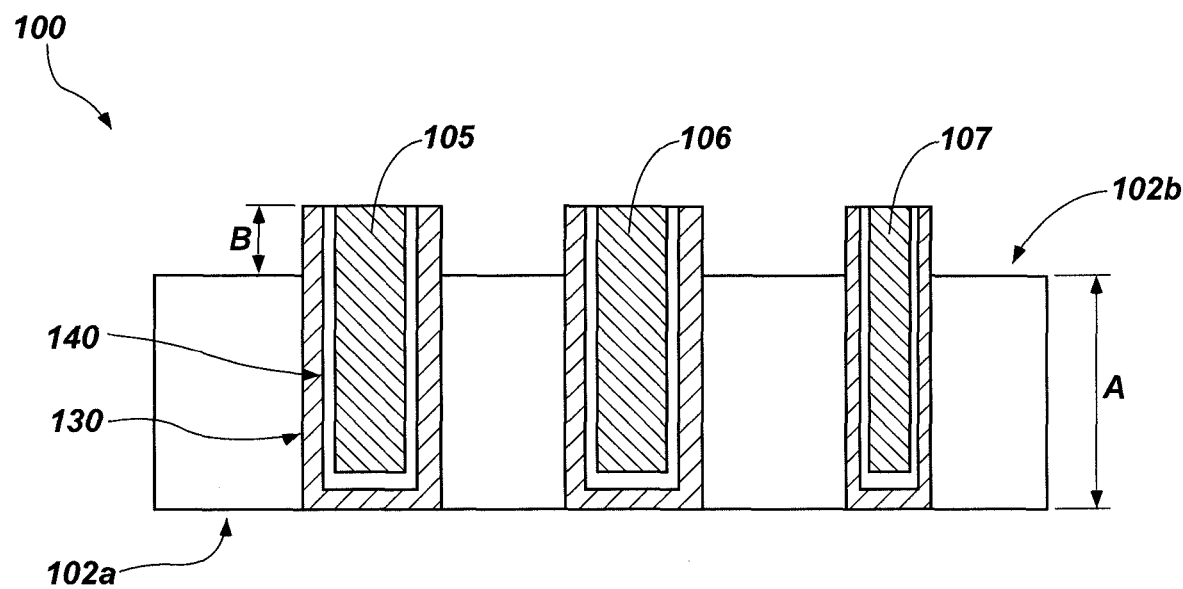

By way of non-limiting example, FIG. 2A illustrates a cross-section view of one embodiment of the semiconductor structure 100 that is disposed on a carrier 110 and has a bonding material 120 positioned therebetween. The semiconductor structure 100 includes a substrate 102; three TSVs (105, 106 and 107); insulating materials 130 and diffusion barrier materials 140 positioned between the substrate 102 and each of the three TSVs (105, 106 and 107). TSVs 105 and 106 have substantially the same dimensions as one another, while TSV 107 has at least one different dimension compared to TSVs 105 and 106. For instance, TSV 107 may differ in width relative to TSVs 105 and 106. After the oxidation of the TSVs 105, 106, 107 and substrate 102 by exposure to an oxidation process, such as an $O_2$ plasma, as previously described, and selective removal of material from the back surface 102b of substrate 102 as previously described, the structure 100 of FIG. 2B is obtained in which the three TSVs (105, 106 and 107) protrude above the surface of substrate 102 at substantially the same height B, and each has the insulating material 130 and the diffusion barrier material 140 overlying the protruding sidewalls. In some embodiments, the protrusion height of the TSVs 105, 106 and 107 may be about 4 microns. Upon removal of carrier 110 and bonding material 120, the semiconductor structure 100 of FIG. 2C is obtained which may be subjected to further processing. In some embodiments, a portion of the substrate 102, insulating material 130 and the diffusion barrier material 140 may be removed to expose at least a portion of the front end of the TSVs 105, 106 and 107. At least one of the TSVs 105, 106, and 107 on the semiconductor structure 100 may be connected to the TSV of at least one other semiconductor structure through a solder joint to form an electronic stack.

A semiconductor structure may comprise a substrate comprising a plurality of copper features therein. An upper portion of the plurality of copper features extends above a surface of the substrate and each of the plurality of copper features extends above the surface of the substrate the same distance.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, equivalents, and alternatives falling within the scope of the present disclosure as defined by the following appended claims and their legal equivalents.

What is claimed is:

1. A semiconductor structure, comprising:
   a first substrate comprising first copper features therein, upper ends of the first copper features protruding above a top surface of the first substrate, lower ends of the first copper features coplanar with a bottom surface of the first substrate; and
   a second substrate stacked on the first substrate, the second substrate comprising second copper features therein, upper ends of the second copper features protruding above a top surface of the second substrate, lower ends of the second copper features coplanar with a bottom surface of the second substrate,
   wherein each of the first copper features of the first substrate protrudes above the top surface of the first substrate substantially the same distance, and
   wherein the protruding upper ends of the first copper features of the first substrate are connected to the lower coplanar ends of the second copper features of the second substrate.

2. The semiconductor structure of claim 1, wherein the first and second copper features comprise through silicon vias filled with copper.

3. The semiconductor structure of claim 1, wherein the upper ends of each of the first copper features extend about 4 microns above the top surface of the first substrate.

4. The semiconductor structure of claim 1, wherein a thickness of the first substrate is about 50 microns.

5. The semiconductor structure of claim 1, wherein the first substrate comprising first copper features therein comprises a silicon substrate comprising through silicon vias filled with copper therein.

6. The semiconductor structure of claim 1, wherein the first substrate further comprises a silicon oxide material over side surfaces of the first copper features protruding above the surface of the first substrate.

7. A semiconductor structure, comprising:
   a first structure comprising a first substrate, at least one first through-substrate via filled with a first conductive material, and an insulating material and a diffusion barrier material over sidewalls of the at least one first through-substrate via, the at least one first through-substrate via comprising a first end protruding above a top surface of the first substrate and a second end coplanar with a bottom surface of the first substrate; and
   a second structure comprising a second substrate, at least one second through-substrate via filled with a second conductive material, the at least one second through-substrate via comprising an end coplanar with a surface of the second substrate, the coplanar end of the at least one second through-substrate via connecting to the protruding first end of the at least one first through-substrate via.

8. The semiconductor structure of claim 7, wherein the first and second conductive materials comprise copper.

9. The semiconductor structure of claim 7, wherein the insulating material comprises silicon oxide.

10. The semiconductor structure of claim 7, wherein the diffusion barrier material comprises a material selected from the group consisting of tantalum (Ta), tantalum nitride (TaN), titanium (Ti), titanium nitride (TiN), titanium aluminum nitride (TiAlN), titanium zirconium (TiZr), and titanium zirconium nitride (TiZrN).

11. The semiconductor structure of claim 7, further comprising a third conductive material connecting the protruding first end of the at least one first through-substrate via to the coplanar end of the at least one second through-substrate via.

12. A semiconductor structure, comprising:
   a first structure comprising a first substrate and at least one first conductive through-substrate via, one end of the at least one first conductive through-substrate via protruding above a top surface of the first substrate and defining at least one contact of the first structure;
   a second structure comprising a second substrate and at least one second conductive through-substrate via, the at least one second conductive through-substrate via comprising one end protruding above a top surface of the second substrate and another end coplanar with a bottom surface of the second substrate, the coplanar end of the at least one second conductive through-substrate via defining at least one contact of the second structure;
   a passivation material on the bottom surface of the second substrate; and
   a conductive material connecting the at least one contact of the first structure to the at least one contact of the second structure.

13. The semiconductor structure of claim 12, further comprising an insulating component over side surfaces of the protruding end of the at least one first conductive through-substrate via.

14. The semiconductor structure of claim 13, wherein the insulating component over side surfaces of the protruding end of the at least one first conductive through-substrate via comprises an insulating material and a diffusion barrier material.

15. The semiconductor structure of claim 12, wherein a width of one through-substrate via of the at least one first conductive through-substrate via differs from the width of other through-substrate vias of the at least one first conductive through-substrate via.

16. The semiconductor structure of claim 12, wherein the protruding end of the at least one first conductive through-substrate via extends from about 2 microns to about 10 microns above the top surface of the first substrate.

17. The semiconductor structure of claim 12, wherein each of the protruding ends of the at least one first conductive through-substrate via extends above the top surface of the first substrate for substantially the same distance.

18. The semiconductor structure of claim 12, wherein the at least one first conductive through-substrate via comprises a through-substrate via filled with copper, and wherein the protruding end of the at least one first conductive through-substrate via is substantially free of copper sulfide.

19. The semiconductor structure of claim 12, wherein the conductive material comprises a material selected from the group consisting of a solder material, a conductive resin, a conductor-filled resin, and an anisotropic conductive film.

20. The semiconductor structure of claim 1, wherein the protruding upper ends of the copper features of the first substrate are substantially free of copper sulfide.

* * * * *